US006243270B1

(12) United States Patent
Yee

(10) Patent No.: US 6,243,270 B1
(45) Date of Patent: *Jun. 5, 2001

(54) METHOD AND APPARATUS FOR ATTACHING A PRINTED CIRCUIT BOARD TO A CHASSIS

(75) Inventor: Dawson L. Yee, Beaverton, OR (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/749,195

(22) Filed: Nov. 14, 1996

(51) Int. Cl.⁷ .................................. G06F 1/16; H05K 7/02
(52) U.S. Cl. ........................ 361/756; 361/683; 361/727; 361/802; 439/374
(58) Field of Search ...................................... 361/683, 686, 361/724, 727, 741, 788, 756, 796, 802; 211/47.17; 439/62, 374, 929

(56) References Cited

U.S. PATENT DOCUMENTS

| 3,760,233 | * | 9/1973 | Warwick ........................... 361/756 X |
| 4,739,452 | * | 4/1988 | Fukunaga ............................ 361/756 |
| 4,896,248 | * | 1/1990 | Zell et al. ....................... 361/756 X |
| 5,019,948 | * | 5/1991 | Steketee et al. .................... 361/802 |
| 5,594,621 | * | 1/1997 | Van Rumpt .......................... 361/686 |

FOREIGN PATENT DOCUMENTS

406021671 * 1/1994 (JP).

* cited by examiner

Primary Examiner—Jayprakash N. Gandhi
(74) Attorney, Agent, or Firm—David J. Kaplan

(57) ABSTRACT

A printed circuit board (PCB) includes a plurality of electronic devices electrically coupled together and disposed on a first side of the PCB. The PCB also includes a rail that is connected to the underside of the PCB. This rail is configured to cooperatively engage a rail guide connected to the chassis of the computer system such that the rail guide holds the rail and the PCB to the chassis, and the PCB and rail can slide with respect to the chassis.

10 Claims, 2 Drawing Sheets

METHOD AND APPARATUS FOR ATTACHING A PRINTED CIRCUIT BOARD TO A CHASSIS

FIELD OF THE INVENTION

The present invention relates to the assembly of a computer system and more particularly to a method and apparatus for attaching a printed circuit board to the chassis of a computer system.

BACKGROUND OF THE INVENTION

The primary parts of a basic, desktop computer system include a keyboard, a monitor, and a box that contains most of the electronic devices that make the computer system work. The box includes a chassis or frame that houses the electronic devices in a convenient form factor. Included in the chassis are electronic devices externally apparent to the computer system user such as a disk drive, CD-ROM drive, and various switches, knobs, sockets, and light indicators. Removing the cover that protects these electronic devices reveals many more key electronic devices including, for example, processors, memory units, clocking devices, interfaces, and peripheral components, all of which are electrically coupled together on printed circuit boards (PCBs). One of these PCBs, usually the PCB containing the central processing unit and main memory, is referred to as the motherboard.

FIG. 1A is a top-down view of motherboard 11 inside chassis 15 in accordance with the prior art. Motherboard 11 is attached to the bottom of chassis 15 by screws 10, and is coupled to socket 12 of riser 13. The edge of motherboard 11 is contained within motherboard edge guide 14. FIG. 1B is a side view of the structure of FIG. 1A along the length of motherboard 11, showing how motherboard 11 is affixed to chassis 15 by screws 10, socket 12, and motherboard edge guide 14. Motherboard 11 contains electronic devices and interconnect lines (not shown), many of which are disposed on the top side of the motherboard.

Motherboard 11 includes electrical contact regions disposed at the edge of the motherboard in the region inserted into socket 12. Motherboard edge guide 14 serves to support the edge of motherboard 11 and to guide the motherboard into socket 12, aligning the electrical contact regions on the edge of the motherboard with corresponding electrical contact regions inside the socket. In this manner, the proper electrical couplings between motherboard 11 and socket 12 are made.

As consumers demand increased computer system functionality in smaller form factors, more electronic devices need to be squeezed into the limited space of PCBs, including motherboard 11. One drawback of the prior art system of FIG. 1A is that there is a significant area of "keep-out" regions on the motherboard. A keep-out region is a region on the PCB where electronic devices cannot be placed because of some mechanical obstruction. For example, screws 10 create keep-out regions in the vicinity of the screw heads, and motherboard edge guide 14 creates a keep-out region in the vicinity of the portion of the guide that overlaps motherboard 11.

As consumers demand lower priced computer systems, it becomes desirable to promote computer system chassis designs that can accommodate PCBs, such as motherboards, from any number of different motherboard vendors. Promoting motherboard competition in this manner typically has the effect of lowering motherboard prices. Motherboards from different vendors, however, may be different sizes. Unfortunately, because the chassis design of the prior art structure of FIG. 1A fixes the distance between motherboard edge guide 14 and the back of chassis 15, this chassis design is unable to accommodate motherboards of varying lengths.

As consumers and computer support personnel demand more easily serviceable computer systems, it becomes desirable to implement a computer chassis design that allows for easy access to the motherboard. Allowing for easy access to the motherboard makes it easier to access key electronic devices such as the processor and system memory so that, for example, a computer system user can quickly upgrade either of these components. Unfortunately, because the chassis design of the prior art structure of FIG. 1A affixes motherboard 11 to the bottom of chassis 15 using screws 10, it is necessary to remove the PCBs and other electronic devices that may be placed above motherboard 11 inside the chassis before removing the screws. This makes it difficult to access and service the electronic components on the motherboard.

SUMMARY OF THE INVENTION

A method and apparatus is described for attaching a printed circuit board to a chassis in a computer system. The printed circuit board (PCB) comprises electronic devices electrically coupled together and disposed on a first side of the PCB. The PCB also includes a rail that is connected to the underside of the PCB. This rail is configured to cooperatively engage a rail guide connected to the chassis of the computer system such that the rail guide holds the rail and the PCB to the chassis, and the PCB and rail can slide with respect to the chassis.

Other features of the present invention will be apparent from the accompanying drawings and the detailed description that follows.

BRIEF DESCRIPTION OF THE DRAWINGS

The present invention is illustrated by way of example and not limitation in the figures of the accompanying drawings in which like references indicate similar elements and in which.

DETAILED DESCRIPTION

A method and apparatus is described for attaching a printed circuit board (PCB), such as, for example, a motherboard, to a chassis in a computer system. Two rails are attached to the bottom of the motherboard, one near the inside edge (opposite the back of the computer system) and the other approximately located at the center of the motherboard. Two corresponding rail guides are attached to the bottom of the computer chassis. The rails on the motherboard cooperatively engage the rail guides attached to the chassis, allowing the motherboard to slide along the rail guides with respect to the chassis.

The cooperative engagement between the rails mounted beneath the motherboard and the rail guides mounted to the chassis provide both support for the motherboard and easy attachment and removal of the motherboard from the chassis, without the need to undo extra screws. This allows for easy access to the motherboard to accommodate servicing of the motherboard. In addition, because the rails are mounted underneath the motherboard, there is no top side encroachment of the rail guides over the motherboard, thereby reducing the area of top side keep-out regions. Also, because the edge of the motherboard is not bounded by a motherboard edge guide, motherboards of varying lengths are supported by this design.

The motherboard and chassis design are described in more detail below to provide a more thorough description of how to implement an embodiment of the present invention. Various other configurations and implementations in accordance with alternate embodiments of the present invention are also described in more detail below.

Figure 1A:
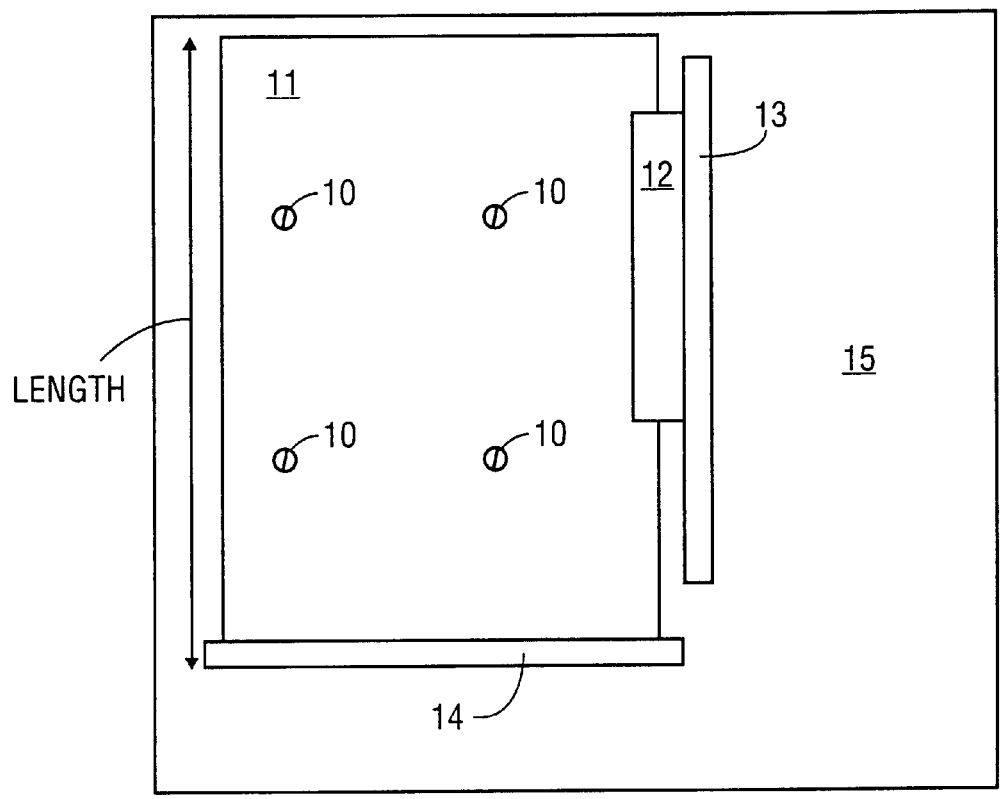
FIG. 1A is a top view of a motherboard in a chassis formed in accordance with the prior art.
Figure 1B:
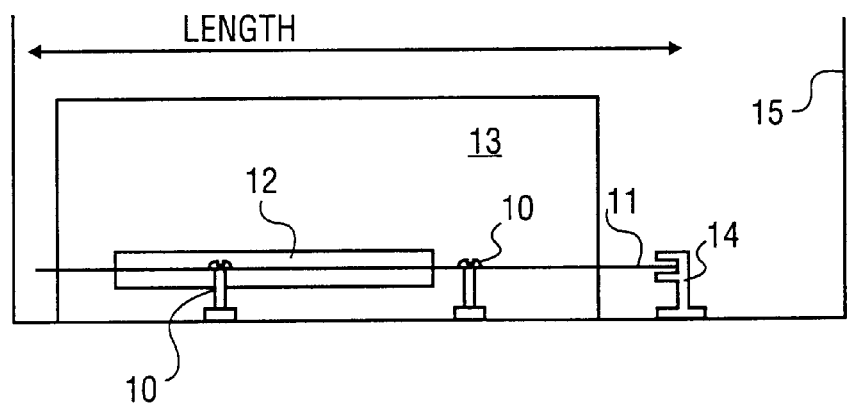
FIG. 1B is a side view of the structure of FIG. 1A.
Figure 2A:
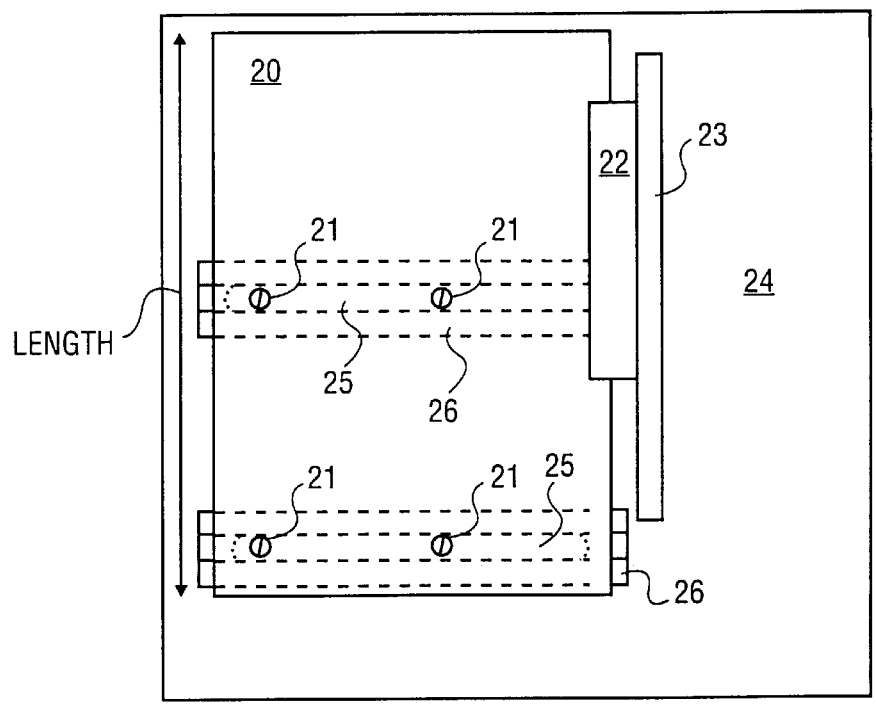
FIG. 2A is a top view of a motherboard in a chassis formed in accordance with one embodiment of the present invention.
Figure 2B:
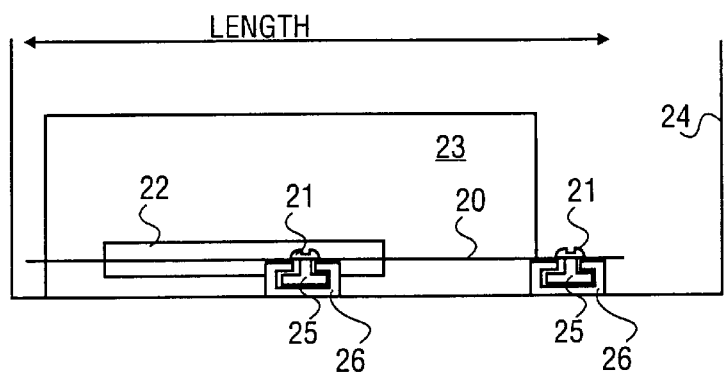
FIG. 2B is a side view of the structure of FIG. 2A.

FIG. 2A is a top-down view of motherboard 20 inside chassis 24 formed in accordance with one embodiment of the present invention. Motherboard 20 is coupled to socket 22 of riser 23, and screws 21 are used to couple rails 25 to the underside of motherboard 20. Rails 25 are coupled to rail guides 26. FIG. 2B is a side view of FIG. 2A along the length of motherboard 20, showing how rails 25 are attached to motherboard 20 by screws 21. Rails 25 fit into corresponding openings in rail guides 26, as shown, to cooperatively engage rail guides 26, allowing rails 25, along with motherboard 20, to slide along rail guides 26. Motherboard 20 contains electronic devices and interconnect lines (not shown), many of which are disposed on the top side of the motherboard, some of which may be disposed on the bottom side as well.

Motherboard 20 includes a electrical contact regions disposed at the edge of the motherboard in the region inserted into socket 22. Rail guides 26 serve to support motherboard 20 and to guide the motherboard into socket 22, aligning the electrical contact regions on the edge of motherboard 20 with corresponding electrical contact regions inside socket 22. In this manner, the proper electrical couplings between motherboard and socket 22 are made. Socket 22 serves to not only support the edge of motherboard 20, but also to hold motherboard 20 in place, keeping the motherboard from sliding out along rail guides 20. For one embodiment of the present invention, an additional latching system is used to prevent the motherboard from sliding back out along the rail guides.

In accordance with one embodiment of the present invention, the back of the computer chassis is represented by the upper boundary of chassis 24 in FIG. 2A. This region includes numerous sockets, many of which extend directly from motherboard 20, out the back of the computer chassis. These sockets may include, for example, a small computer serial interface (SCSI) port, printer port, telephone jack, keyboard/mouse port, monitor port, network port, or a universal serial bus (USB) socket. Because these sockets extend out the back of the computer system, they are typically attached directly to the back of the computer system chassis to provide support for when users attempt to plug corresponding cable lines into these sockets in the back of the system. Support for motherboard 20 at the edge of the motherboard closest to the back of the chassis, the outside edge, is provided by the attaching of these sockets to the back of the chassis.

Therefore, in accordance with one embodiment of the present invention, only the inside edge of the motherboard needs to be supported by a rail because the outside edge of the motherboard is sufficiently supported by the motherboard sockets that are attached to the back of the chassis. For this embodiment, a rail is affixed underneath the motherboard in a region near the inside edge of the motherboard within approximately two inches from the edge of the motherboard. For an alternate embodiment of the present invention, a rail is affixed underneath the motherboard in a region near the outside edge of the motherboard as well, within approximately two inches from the edge of the motherboard.

In accordance with one embodiment of the present invention, the center of the motherboard is also supported by the rail and rail guide. For this embodiment, a rail is attached in a region underneath the motherboard near the center of the motherboard, within approximately two inches from the center of the motherboard.

For one embodiment of the present invention, only a single rail is attached to the motherboard, located in a position underneath the motherboard where sufficient support is provided to the motherboard when the rail cooperatively engages a rail guide affixed to the chassis. For another embodiment of the present invention, two or more rails are used, along with corresponding rail guides, to attach the motherboard to the chassis, allowing the motherboard to slide along the rail guides.

The rails that mate with the rail guides are attached underneath the motherboard rather than at the edge of the motherboard, allowing the edge of the motherboard to be unbounded by a guide. As a result, a computer system chassis designed in accordance with the present invention accommodates different motherboards having different lengths. For one embodiment of the present invention, motherboard lengths in the range of approximately 9 to 14 inches are supported. In addition, for one embodiment of the present invention, motherboard widths in the range of approximately 7 to 10 inches are supported.

Figure 3:
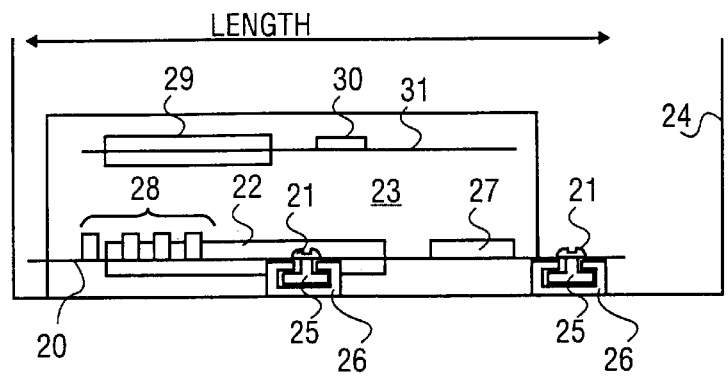
FIG. 3 is the structure of FIG. 2B after additional components have been added in accordance with an embodiment of the present invention.

FIG. 3 is the structure of FIG. 2B after some additional components have been added in accordance with an embodiment of the present invention. An additional socket 29 is attached to riser 23. PCB 31 contains electronic devices and interconnect lines (most of which are not shown). PCB 31, to which electronic device 30 is coupled, is inserted into socket 29, suspending PCB 31 over motherboard 20. Electronic devices, including processor 27 and memory modules 28, are shown coupled to the top side of motherboard 20.

For one embodiment of the present invention, just as motherboard 20 includes electrical contact regions disposed at the edge of the motherboard in the region inserted into socket 22, PCB 31 includes electrical contact regions disposed at the edge of the PCB in the region inserted into socket 29. The electrical contact regions on the edge of the PCB are aligned with corresponding electrical contact regions inside socket 29. In this manner, the proper electrical couplings between PCB 31 and socket 29 are made.

Riser 23 includes interconnect lines (not shown) that electrically couple electrical contact regions of socket 22 to electrical contact regions of socket 29. In this manner, electronic devices attached to motherboard 20 are electrically coupled to corresponding electronic devices attached to PCB 31. For example, for one embodiment of the present invention, electronic device 30 is a digital signal processor that receives a video signal and compresses the signal into a digital format. This compressed signal is then sent along interconnect lines of PCB 31, through socket 29, along interconnect lines of riser 23, through socket 22, and along interconnect lines of motherboard 20 to processor 27. Processor 27 processes the signal and stores the results in memory modules 28.

To enhance the capability of this computer system, a user upgrades processor 27 by, for example, swapping processor 27 with a processor that operates at a faster speed, and upgrades memory modules 28 by adding additional memory modules or swapping with memory modules having more memory capacity. To implement either or both of these enhancements, the user needs to directly access motherboard 20. In accordance with one embodiment of the present invention, this is accomplished by sliding motherboard 20 straight out of socket 22, along rail guides 26, and out of the chassis. Note that in accordance with this embodiment of the present invention, there is no need to either remove PCB 31 from socket 29, or remove screws attaching the motherboard to the bottom of the chassis.

In this manner, a motherboard and chassis formed in accordance with the present invention provides for easy access to the motherboard for upgrading electronic devices on the motherboard. In addition, the present invention facilitates the swapping of one motherboard for another, even if they are of different lengths. Also, because top-side encroachment over the motherboard is reduced, there are fewer keep-out regions on the motherboard, allowing more electronic devices to be placed on top of the motherboard.

In the foregoing specification, the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A printed circuit board (PCB) including a board consisting of two rails affixed thereto, and further comprising:
   a plurality of electronic devices electrically coupled together and disposed on a first side of the board;
   a first rail of the up to two rails affixed to a second side of the board to cooperatively engage a first rail guide affixed to a chassis, the first rail being set in from an edge of the board within a distance from the edge; and
   a second rail of the up to two rails affixed to the second side of the board to cooperatively engage a second rail guide affixed to a chassis, the second rail being located at an approximate center of the board within a distance from the center.

2. The PCB of claim 1, further comprising a plurality of electrical contact regions disposed at an edge of the board and configured to electrically couple the plurality of electronic devices on the board to a socket affixed to a riser.

3. The PCB of claim 1, wherein the board is a motherboard.

4. The PCB of claim 1, wherein the plurality of electronic devices includes a processor.

5. A motherboard consisting of two rails affixed thereto, and further comprising:
   a plurality of electronic devices electrically coupled together and disposed on a first side of the motherboard;
   a plurality of electrical contact regions disposed at a first edge of the motherboard to electrically couple the plurality of electronic devices to a socket affixed to a riser;
   a first rail of the two rails affixed to a second side of the motherboard to cooperatively engage a first rail guide affixed to a chassis, the first rail being set in from a second edge of the motherboard within approximately two inches; and
   a second rail of the two rails affixed to the second side of the motherboard to cooperatively engage a second rail guide affixed to a chassis, the second rail being within two inches from the center of the board.

6. A computer system comprising:
   a motherboard consisting of two rails affixed thereto;
   a first plurality of electronic devices electrically coupled together and disposed on a first side of the motherboard;
   a plurality of electrical contact regions disposed at a first edge of the motherboard;
   a riser comprising a first socket and a second socket, the riser being coupled to the first edge of the motherboard by the first socket;
   a first rail of the two rails affixed to a second side of the motherboard, the first rail being set in from a second edge of the board within a first distance from the second edge;
   a second rail of the two rails affixed to the second side of the motherboard to cooperatively engage a second rail guide, the second rail being located at an approximate center of the board within a second distance from the center; and
   a chassis to which a first rail guide is affixed, the first rail guide cooperatively engaging the first rail such that the first rail and the motherboard are held to the chassis.

7. The computer system of claim 6, further comprising a printed circuit board coupled to the second socket and having a second plurality of electronic device disposed thereon, the second plurality of electronic devices being electrically coupled to the first plurality of electronic device via the first socket, the riser, and the second socket.

8. The computer system of claim 6, wherein the plurality of electronic devices includes a processor, and the first and second distances are approximately two inches.

9. A method for inserting a motherboard into a computer system chassis, the method comprising the steps of:
   engaging a first rail of exactly two rails affixed to the motherboard, the first rail being set in from a first edge of the motherboard within a distance from the first edge, with a first rail guide affixed to the chassis;
   engaging a second rail of the two rails affixed to the motherboard, the second rail being affixed within a distance from a center of the motherboard, with a second rail guide affixed to the chassis;
   sliding the motherboard along the first rail to maintain cooperative engagement with the first rail guide; and
   inserting a second edge of the motherboard into a first socket affixed to a riser.

10. The method of claim 9, further comprising the step of inserting an edge of a printed circuit board into a second socket affixed to the riser.

* * * * *